United States Patent [19]
Tsujita

[11] Patent Number: 5,872,054
[45] Date of Patent: Feb. 16, 1999

[54] ANTI-REFLECTION FILM AND METHOD OF MANUFACTURING

[75] Inventor: Kouichirou Tsujita, Hyogo-ken, Japan

[73] Assignee: Mitsubishi Denki Kabushiki Kaisha, Tokyo, Japan

[21] Appl. No.: 725,383

[22] Filed: Oct. 3, 1996

Related U.S. Application Data

[60] Continuation of Ser. No. 325,734, Oct. 19, 1994, abandoned, which is a division of Ser. No. 43,698, Apr. 8, 1993, abandoned.

[30] Foreign Application Priority Data

Apr. 16, 1992 [JP] Japan ............................ 4-96678

[51] Int. Cl.$^6$ ............................................. H01L 21/318
[52] U.S. Cl. ............................................. 438/636; 438/792
[58] Field of Search ................................ 437/241, 225; 438/792, 793, 636

[56] References Cited

U.S. PATENT DOCUMENTS

| | | |
|---|---|---|
| 4,158,717 | 6/1979 | Nelson ................................... 428/446 |
| 4,312,921 | 1/1982 | Hirai et al. . |
| 4,451,969 | 6/1984 | Chaudhuri ............................... 29/572 |
| 4,488,775 | 12/1984 | Yamamoto .............................. 350/164 |
| 4,545,646 | 10/1985 | Chern et al. ......................... 350/162.2 |
| 4,545,823 | 10/1985 | Drowley ................................... 148/1.5 |
| 4,561,906 | 12/1985 | Galder et al. ........................... 148/1.5 |
| 4,606,115 | 8/1986 | Kervin et al. ............................ 29/572 |
| 4,618,541 | 10/1986 | Furouhi et al. ......................... 428/688 |
| 4,640,001 | 2/1987 | Koiwai et al. ............................ 29/572 |
| 4,668,365 | 5/1987 | Foster et al. . |
| 4,691,077 | 9/1987 | Gregory et al. ........................ 136/256 |
| 4,751,191 | 6/1988 | Gonsiorawski et al. ................... 437/2 |
| 4,820,611 | 4/1989 | Arnold, III et al. ..................... 430/271 |
| 4,863,755 | 9/1989 | Hess et al. . |
| 4,968,147 | 11/1990 | Chern et al. ........................ 350/162.24 |

(List continued on next page.)

FOREIGN PATENT DOCUMENTS

| | | |
|---|---|---|
| 0379604 | 8/1990 | European Pat. Off. . |
| 3234066 | 3/1983 | Germany . |
| 60-185928 | 9/1985 | Japan . |

OTHER PUBLICATIONS

Oijkstra, Han J. and Casper A. H. Juffermans, "Optimization of Anti–Reflection Layers for Deep UV II Lithography", SPIE vol. 1927 Optical/Laser Microlithography VI (1993) p. 275, 1993.

"High contrast single layer resists and antireflection layers—an alternative to multilayer resist techniques" by C. Nölscher et al., pp. 242–250, SPIE vol. 1086 Advances in Resist Technology and Processing VI (1989).

"O.5μm Lithography Using i–line Stepper of Noo.45 and High Performance Resist" by Christopher F. Lyons, Solid State Technology, Jan. 1991, pp. 41–47.

Solid State Technology in Japanese, Jan. 1992, p. 17.

Extended Abstracts of the 1993 International Conference on Solid State Devices and Materials, Makuhari, 1993, pp. 570–572, Aug. 1993.

SPIE, vol. 1674, Optical/Laser Microlithography V (Mar. 1991), pp. 350–361.

Wolf, Stanley, 'Si Proc for the VLSI Era', Lattice Press, CA (1986) pp. 439–441.

Wolf, Stanley, "Silicon Processing For Taz VLSI Era", Vol. 2, Lattice Press, CA (1990), pp. 273–275 & 337.

Primary Examiner—Charles L. Bowers, Jr.
Attorney, Agent, or Firm—McDermott, Will & Emery

[57] ABSTRACT

Values of a real part n and an imaginary part k of the relation indicating a complex refractive index as an optical characteristic of an anti-reflection film are selected to be in the ranges of 1.0<n<3.0 and 0.4<k<1.3, respectively. The values of the real part and n and the imaginary part k of the complex refractive index are set in the above-described range by changing parameters of composition of a material of a plasma nitride film formed by a plasma CVD method. By this method, it is possible to easily select the anti-reflection film having an optimum optical characteristic without depending on experiments.

1 Claim, 15 Drawing Sheets

U.S. PATENT DOCUMENTS

| | | | |
|---|---|---|---|
| 5,040,044 | 8/1991 | Noguchi et al. | 352/52 |
| 5,066,615 | 11/1991 | Brady et al. | 437/229 |
| 5,091,244 | 2/1992 | Biornard | 428/216 |
| 5,126,289 | 6/1992 | Ziger | 437/231 |
| 5,177,581 | 1/1993 | Kubo et al. | |
| 5,331,191 | 7/1994 | Sugiura et al. | |
| 5,378,659 | 1/1995 | Roman et al. | 437/229 |
| 5,488,246 | 1/1996 | Hayashide et al. | |
| 5,595,938 | 1/1997 | Miyazaki | 437/195 |

REFLECTANCE(R) OF AT THE TIME OF THE i-LINE
($\lambda$=365nm)

REFLECTANCE(R) OF AT THE TIME OF krF($\lambda$=248nm)

THE RELATION BETWEEN n AND k WHICH THE PLASMA NITRIDE FILM CAN ASSUME.

THE RELATION BETWEEN THE COMPOSITION RATIO OF Si AND N AND OPTICAL CHARACTERISTICS OF PLASMA NITRIDE FILM AT THE TIME OF THE krF.

THE RELATION BETWEEN n AND k WHICH THE PLASMA NITRIDE FILM CAN ASSUME.

ANTI-REFLECTION FILM AND METHOD OF MANUFACTURING

This application is a continuation of application Ser. No. 08/325,734, filed Oct. 19, 1994, which is a division of application Ser. No. 08/043,698, filed Apr. 8, 1993, both now abandoned.

BACKGROUND OF THE INVENTION

1. Field of the Invention

The present invention relates to an anti-reflection film used in photolithography during the steps of manufacturing a semiconductor device and a method of manufacturing the same.

2. Description of the Background Art

In every step of manufacturing a semiconductor device, photolithography is used in which a resist film is formed in a predetermined pattern by using a photomask. Then, the pattern of the resist film is transferred to a silicon wafer.

Description will be given to the step of forming a word line as a step of manufacturing a conventional DRAM (Dynamic Random Access Memory) hereinafter.

Referring to FIG. 13, an insulating film 51 is formed on a semiconductor substrate 50. A polysilicon film 52a is formed on insulating film 51. An insulating film 52b is formed on polysilicon film 52a. On insulating film 52b formed is a resist film 53. A photomask 54 having a predetermined pattern formed thereon is disposed above resist film 53. An exposure light 55 such as an i-line ($\lambda$=365 nm) or krF light ($\lambda$=248 nm) is directed to resist film 53 from above photomask 54 therebetween.

Referring to FIG. 14, the resist film 53 is exposed by exposure light 55 along the pattern of the photomask. Thereafter, prescribed portions of the resist film 53 are removed by development.

Referring to FIG. 15, etching of insulating film 52b and polysilicon film 52a is carried out by dry etching 57 with resist film 53 used as a mask. Referring to FIG. 16, by removing resist film 53, a word line 52 is completed.

When there is a stepped portion in an underlying film such as a word line, however, exposure light is reflected by the stepped portion, causing a problem that a resist film of a desired shape cannot be formed. Description will be given to the problem hereinafter with reference to FIG. 17. FIG. 17 is a cross section in which an element isolation region 56 is formed on semiconductor substrate 50.

Element isolation region 56 and insulating film 51 are formed on semiconductor substrate 50. There is a stepped portion 56a at a joint of element isolation region 56 and insulating film 51.

Polysilicon film 52a and insulating film 52b are formed along the surface of element isolation region 56 and insulating film 51. Insulating film 52b has a stepped, portion 52c along stepped portion 56. Resist film 53 is formed on the upper surface of insulating film 52b. Resist film 53 has a flat surface. Photomask 54 having a predetermined pattern is disposed above resist film 53.

Exposure light 55 such as the i-line ($\lambda$=365 nm) or krF light ($\lambda$=248 nm) is directed to resist film 53 from above, with photomask 54 therebetween. Referring to FIG. 18, exposure light 55 reaching insulating film 52b is reflected by the surface of insulating film 52b. An exposure light 55a directed to a flat portion of the surface of insulating film 52b is reflected in the incident direction. Exposure lights 55b, 55c, 55d and 55e directed to stepped portion 52c of insulating film 52b, however, are reflected in accordance with a tilt angle of stepped portion 52c as shown in the figure. Reflected lights 55b, 55c, 55d and 55e of exposure light 55 expose a region of a resist film 53c which is not to be exposed originally.

Referring to FIG. 19, resist film 53 formed as described above has a chipped portion as shown in the figure. If polysilicon film 52a and insulating film 52b are etched by dry etching 57 using resist film 53, portions of polysilicon film 52a and insulating film 52b not to be etched are etched as shown in FIGS. 20 and 21. As a result, a word line 52 having a predetermined shape is not formed.

Referring to FIG. 22, provision of an anti-reflection film 58 on insulating film 52b for preventing reflection of exposure light is a known technology in order to eliminate the above-described problem. Reflectance required in the step of general photolithography is 10% or less, and anti-reflection film 58 primary of TiN has conventionally been used.

Description will now be given to a method of forming word line 52 when anti-reflection film 58 of TiN is used.

Referring to FIG. 22, anti-reflection film 58 of TiN is formed on the upper surface of insulating film 52a by using a sputtering method or the like. Resist film 53 is formed on anti-reflection film 58. Photomask 54 having a predetermined pattern is disposed above resist film 53.

Referring to FIG. 23, exposure light 55 such as the i-line ($\lambda$=365 nm) or the krF light ($\lambda$=248 nm) is directed to resist film 53 from above, with photomask 54 therebetween. At this time, exposure light 55 reaching insulating film 52b is scarcely reflected by stepped portion 52a because of anti-reflection film 58. This enables exposure in accordance with a pattern of resist film 53 and resist film 53 of a desired shape can be obtained.

Referring to FIG. 24, with resist film 53 used as a mask, anti-reflection film 58, insulating film 52b and polysilicon film 52a are etched by etching 57 to form word line 52. Then, referring to FIG. 25, by removing resist film 53 and anti-reflection film 58 remaining on word line 52, word line 52 shown in FIG. 26 is completed.

However, a TiN film used as the anti-reflection film has a problem as in the following.

(1) It is difficult to dry-etch the TiN film since a titanium atom has a low vapor pressure to any compound.

(2) Taking the above problem (1) in consideration, a TiN film is formed on a Si material. When the TiN film is etched to a prescribed shape by wet etching using $H_2SO_4/H_2O_2$, the Si material is not etched at all. However, since side etches are caused in the TiN film by wet etching, it is difficult to etch the TiN film to a prescribed shape.

(3) Since titanium has a level in a band gap in silicon, leak current and the like are increased, resulting in degraded characteristics of Si as a semiconductor.

SUMMARY OF THE INVENTION

One object of the present invention is to provide an anti-reflection film of higher performance by specifying a complex refractive index indicating optical characteristics of the anti-reflection film.

Another object of the present invention is to provide a method of manufacturing an anti-reflection film by which anti-reflection film of higher performance can be obtained by specifying a complex refractive index indicating optical characteristic of the anti-reflection film.

In order to solve the above-described problems, the method of manufacturing the anti-reflection film based on the present invention includes the steps of selecting a complex refractive index, which is an optical characteristic of the anti-reflection film used in photolithography in the process of manufacturing a semiconductor device, and selecting other characteristics required for the anti-reflection film. The above step of selecting the complex refractive index includes the step of determining values of a real part n and an imaginary part k of the relation n−i×k (where i is an imaginary unit) indicating the complex refractive index to be in the ranges of 1.0<n<3.0 and 0.4<k<1.3, respectively, when the exposure light in the photolithography has a wavelength in the range of the i-line (λ=365 nm) to the krF light (λ=248 nm).

According to the method of manufacturing an anti-reflection film of the present invention, the values of the real part n and of the imaginary part k of the relation n−i×k indicating the complex refractive index, which is an optical characteristic of the anti-reflection film are selected to be in the predetermined ranges, respectively.

Consequently, an appropriate anti-reflection film can be formed without experimentally measuring the refractive index.

In one aspect, the anti-reflection film of the present invention includes an anti-reflection film used in the photolithography in the process of manufacturing a semiconductor device, including a plasma nitride film ($Si_xN_y$: x, y are parameters) formed by a plasma CVD method. Exposures light used in the photolithography is the i-line (λ=365 nm). The values of the real part n and the imaginary part k of the relation n−i×k (where i is an imaginary unit) indicating the complex refractive index of the above plasma nitride film ($Si_xN_y$) are set to 1.0<n<3.0 and 0.4<k<1.3, respectively, by changing the composition of the material of the above plasma nitride film ($Si_xN_y$), whereby the ratio of parameters (X, Y) of the above plasma nitride film ($Si_xN_y$) are set to 1.0<X/Y<1.4.

Consequently, an anti-reflection film formed of plasma nitride film having optimal reflectance when the exposure light is i-line (λ- 365 nm) can be obtained.

In another aspect, the anti-reflection film of the present invention includes an anti-reflection film used in photolithography in the process of manufacturing a semiconductor device including a plasma nitride film ($Si_xN_y$: X, Y are parameters) formed by a plasma CVD method. Exposure light used in the photolithography is the krF light (μ=248 nm). The values of real part n and the imaginary part k of the relation n−i×k (where i is an imaginary unit) indicating the complex refractive index of the above plasma nitride film ($Si_xN_y$) are set to 1.0<n<3.0 and 0.4<k<1.3, respectively, by changing parameters (X, Y) of the composition of the material of the above plasma nitride film ($Si_xN_y$), whereby the ratio of parameters (X, Y) of the above plasma nitride film ($Si_xN_y$) is set to 0.75<X/Y ≦0.85.

Consequently, anti-reflection film formed of a plasma nitride film having optimal reflectance when exposure light is krF-light (λ- 248 nm) can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description will be given to a method of selecting an anti-reflection film based on the present invention with reference to FIGS. 1 to 12.

The method of manufacturing the anti-reflection film is roughly divided into the step of selecting a complex refractive index as an optical characteristic of the anti-reflection film, and the step of selecting other characteristics required for the anti-reflection film. The present invention is characterized in the former step of selecting the complex refractive index as the optical characteristic of the anti-reflection film.

Therefore the following description will refer to the step of selecting the complex refractive index.

Figure 1:
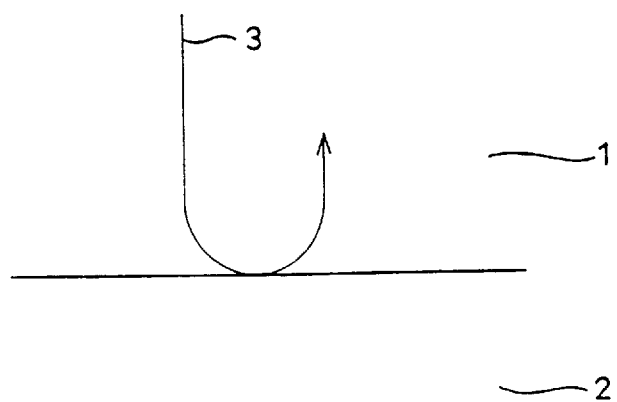
FIG. 1 is a schematic diagram for finding a general reflectance.

Referring to FIG. 1, a reflectance R will be described. FIG. 1 is a schematic diagram when a resist film 1 having the infinite thickness is formed on an anti-reflection film 2 having the infinite thickness. The reflectance R of exposure light 3 in this case is expressed by:

$$R = \left| \frac{(nr - i \cdot k\gamma) - (n - i \cdot k)}{(nr - i \cdot k\gamma) + (n - i \cdot k)} \right| \quad (1)$$

where (nr–i·kγ) is a complex refractive index of resist film 1, and (n–i·k) is a complex refractive index of anti-reflection film 2.

The complex refractive index will now be described. The refractive index and the absorption coefficient are important physical quantities in considering entrance or transmission of light in a substance. The refractive index and the absorption coefficient are generally referred to as optical constants. The refractive index is indicated by the ratio of the speed of light in vacuum to that of light in the substance. The absorption coefficient indicates the ratio at which energy of light is absorbed in the substance. Both of them vary depending on the wavelength or the number of vibration of light.

Substance is generally constituted of atoms. An atom is constituted of a positively charged atomic nucleus and negatively charged electrons. The wave of light from the outside of the substance is an external force having sinusoidal vibration with respect to the atom. This external force interacts with continuous vibration occurring in the atom, thereby inducing new vibration.

Assume that an electron having mass m and a negative charge –q is connected by a spring to an atomic nucleus at a fixed position (as the atomic nucleus has mass 1800 times or more than the mass of the electron). When the electron is displaced by x, a restoring force K x x (where K is a modulus of elasticity) in proportion to the displacement is exerted. Consider a vibrator model of one dimension on which the restoring force K x x works. When an external vibrating electric field E (=$E_0e^{j\omega T}$) of light is applied to the vibrator, the electron begins forced vibration by the vibrating field E. The equation of motion of the electron with regard to the x coordinate at this time is as follows:

$$m\frac{d^2x}{dt^2} + my\frac{dx}{dt} + m\omega_0 x = -qE_0 e^{j\omega t} \quad (2)$$

In the equation, the right side is an external force, and the third term of the left side is an elastic restoring force of the spring, a frequency of which corresponds to $\omega_0$=(K/m).

The second term of the left side is attenuation when absorption of light by substance is taken into consideration. γ is an attenuation coefficient. The solution of the equation (2) is:

$$x(t) = \frac{q}{m} \cdot \frac{E_0 e^{j\omega t}}{\omega_0^2 - \omega^2 + j\gamma\omega} \quad (3)$$

The right side of the above equation is in the form of the complex function of ω. The electron connected to the spring vibrates at the same number of vibration as that of the external vibrating electric field of light. However, the amplitude varies depending on ω, and the phase of the electron shifts from that of the light because of γ which slows the movement of the electron.

Now consider the movement of the electron as the motion of the negative charge. Assume that the negative charge is displaced by x from its parallel position by action of the electric field. The induced dipole moment by the electric field of light of the negative charge becomes q x x (t). If substance is formed of n atoms or molecules per unit volume, the polarization P equals to P=nqx. The polarization P is proportional to the electric field of light unless a strong electric field such as laser light is considered. The following relation holds between the polarization P and the dielectric constant $\epsilon_r$ of the dielectric:

$$\epsilon r = 1 + \frac{P}{\epsilon_0 E} \quad (4)$$

where $\epsilon_0$ is the dielectric constant under vacuum.

Since the relation $n^2 = \epsilon_r$ holds between the refractive index n and the dielectric constant of substance, applying the relation to $\epsilon_r$ and P of the equation (4), it holds that:

$$(n')^2 = 1 + \frac{Nq^2}{\epsilon_0 m} \cdot \frac{1}{(\omega_0^2 - \omega^2) + j\gamma\omega} \quad (5)$$

The refractive index is indicated as the complex function of ω similar to x. More specifically, letting the real part and the imaginary part of the refractive index are represented by n and k, respectively, the complex refractive index n' is:

$$n' = n - i \times k \quad (6)$$

Figure 2:
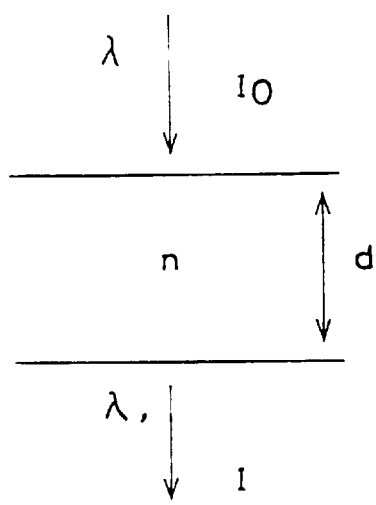
FIG. 2 is a schematic diagram for indicating a phase change of light incident on a predetermined substance.

Referring to FIG. 2, description will be given to the case where light of the wavelength λ and the amplitude $I_0$ passes through the film of the thickness d and the refractive index n and is turned into light of the wavelength λ' and the amplitude I.

The relation between the amplitude $I_0$ and the amplitude I is:

$$I = I_0 \times e^{-i\theta} \quad (a)$$

($e^{-i\theta}$ is the index showing the state of change of amplitude when the phase is rotated by θ in the substance $I_0$)

θ is expressed as in the following:

$$\theta = 2 \cdot \pi \cdot \frac{d}{\lambda'} = 2 \cdot \pi \cdot d \frac{n'}{\lambda} \quad (b)$$

(where n' is the complex refractive index)

Therefore, according to the equations (a), (b) and (6), the following is obtained:

$$e^{-i\theta} = \exp\left\{ -i \cdot \frac{2\pi d}{\lambda} (n - i \cdot k) \right\} \quad (c)$$

$$= \exp\left\{ -i \cdot \left(2nd\frac{n}{\lambda}\right) \right\} \cdot \exp\left\{ -2\pi d \frac{k}{\lambda} \right\} \quad (7)$$

$\exp\left\{ -i \times \left(2\pi d \frac{n}{\lambda}\right) \right\}$ indicates the phase rotation, and $\exp\left\{ -2nd\frac{k}{\lambda} \right\}$ indicates absorption.

Figure 3:
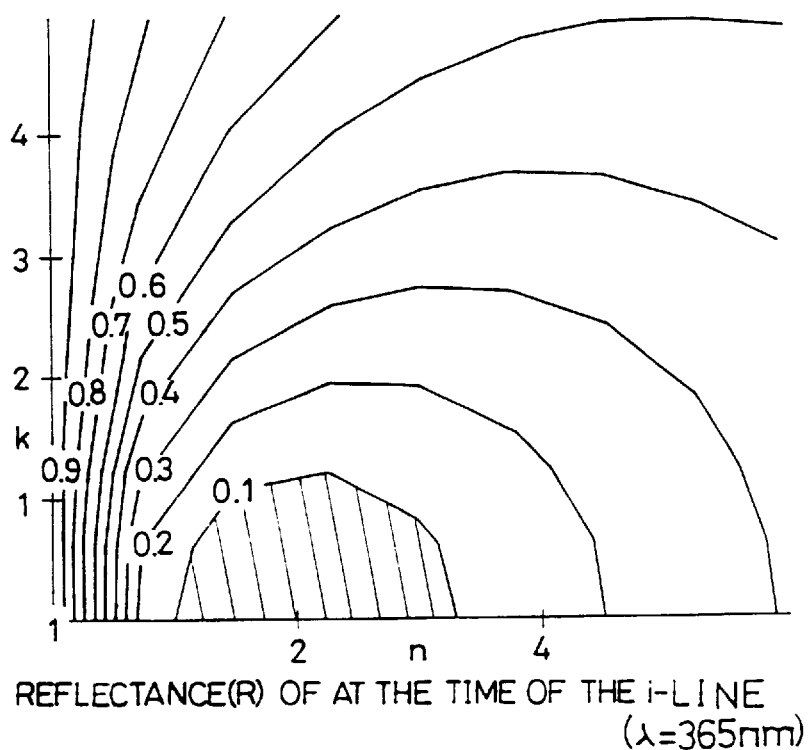
FIG. 3 is a diagram showing a reflectance (R) and the relation between the real part n and the imaginary part k of a complex refractive index at the time of the i-line (λ=365 nm) incidence.

In the equation (1), when the i-line (λ=365 nm) is used as exposure light, the refractive index of resist film 1 becomes 1.72 - 0.02i. FIG. 3 is a graph showing the result of calculation, in which the ordinate and the abscissa indicate the real part n and the imaginary part k, respectively, of the reflectance R of the anti-reflection film.

In FIG. 3, the reflectance with regard to n and k where n and k are variables is shown by contour lines (in the figure, 0.1 indicates that the reflectance is 10% and 0.2 indicates that the reflectance is 20%).

Figure 4:
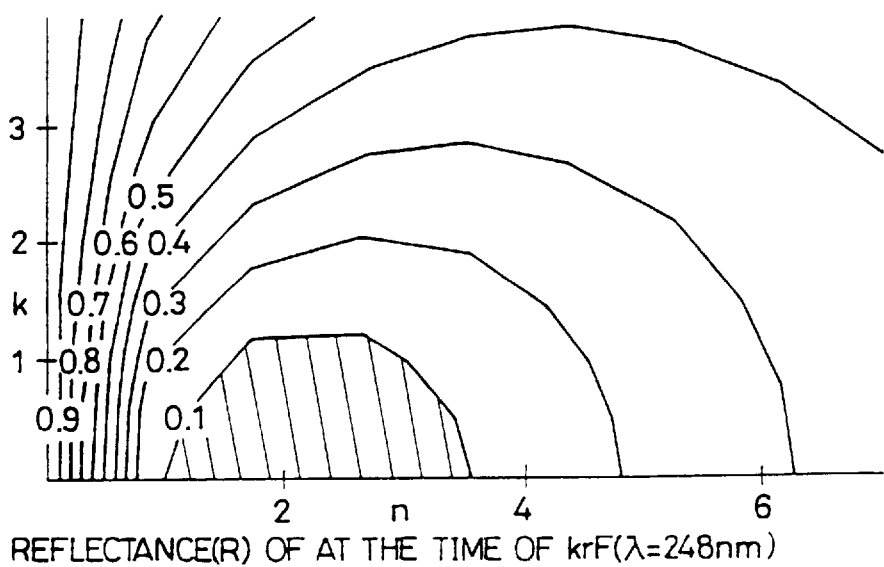
FIG. 4 is a diagram showing the reflectance (R) and the relation between the real part n and the imaginary part k of the complex refractive index at the time of the krF light (λ=248 nm) incidence.

Similarly, FIG. 4 shows the result of calculation of the reflectance R when the krF light ($\lambda$=248 nm) is used as exposure light. In this case, the complex refractive index of the resist film is 1.83 - 0.01i.

In the steps of general photolithography, reflection of light by a stepped portion can be ignored if the reflectance R is 10% or less.

Referring to FIGS. 3 and 4, when regions where the reflectance is 10% or less are shown by hatched areas, it is found that, in the regions, the values n and k are 1<n<3 and 0<k<1.3, respectively.

The reason why the i-line ($\lambda$=365 nm) and the krF light ($\lambda$=248 nm) are used as the above exposure light is that the refractive index with regard to the substance is not substantially changed in the range of the wavelength of the i-line ($\lambda$=365 nm) to krF light ($\lambda$=248 nm) in general substance. Therefore, it can be said that the above-described values of n and k are also effective for light of the wavelength in the range of the i-line to the krF light.

However, when the value of k is too small, the ratio of transmission of exposure light 3 through anti-reflection film 2 is high. Therefore, the film needs to have a large thickness to be used as anti-reflection film 2.

The condition under which exposure light does not transmit the anti-reflection film will now be described.

Figure 5:
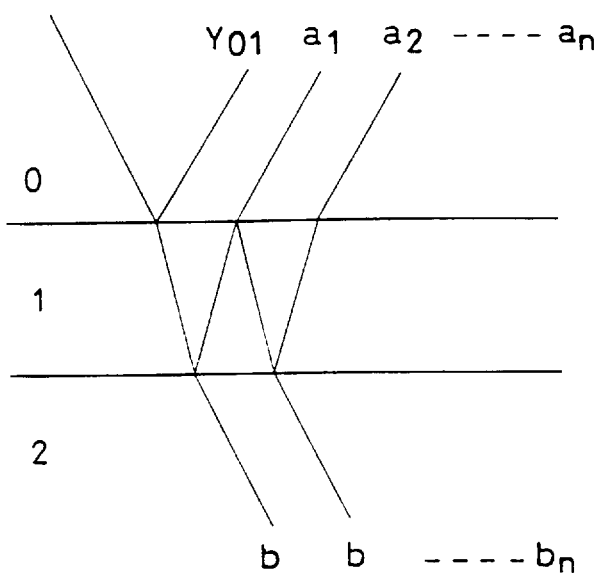
FIG. 5 is a schematic diagram for measuring the reflectance of multi-reflected light.

Referring to FIG. 5, reflection of light directed to a three-layered film of substances 0, 1 and 2 will be described. The light incident on the aforementioned three-layered film results in light $\gamma_{01}$ reflecting at an interface between substance 0 and substance 1 and lights $a_1, a_2, \ldots, a_n$ producing multi-reflection in substance 1. The reflectance $a_n$ of these lights including $\gamma_{01}$ is given by the following equation, where $t_{ij}$ represents transmittance from substance i to substance j, $\gamma_{ij}$ represents reflectance at the interface when the light proceeds from substance i to substance j and $\Delta$ represents phase difference when the light goes into and reflected back from the substance 1:

$$a_1 = t_{01} \cdot \gamma_{12} \cdot t_{10} \cdot e^{-i\delta}$$

$$a_2 = t_{01} \cdot \gamma_{12}^2 \cdot \gamma_{10} \cdot t_{10} \cdot e^{-i\cdot 2\cdot\delta}$$

.
.
.

$$a_n = t_{01} \cdot (\gamma_{12})^n \cdot (\gamma_{10})^{n-1} \cdot t_{10} \cdot e^{-i\cdot n\cdot\delta}$$

wherein $$t_{01} \cdot t_{10} + \gamma_{01}^2 = \frac{2 \cdot n_0}{n_0 + n_1} \cdot \frac{2n_1}{n_0 + n_1} + \left(\frac{n_0 - n_1}{n_0 + n_1}\right)^2$$

$$= 1$$

Therefore, it holds that $$t_{01} \cdot t_{10} = 1 - \gamma_{01}^2$$

and it holds that $$a_n = (1-\gamma_{01}^2) \cdot \gamma_{12} \cdot e^{-i\epsilon}(\gamma_{12} \cdot r_{10} \cdot e^{i\cdot\epsilon})^{n-1} \quad (8)$$

The reference R of multi-reflected light is $$R = \gamma_{01} + \sum_{n-1}^{\infty} a_n$$

By substituting the equation (8) into the above equation, it holds that:

$$R = \gamma_{01} + (1 - \gamma_{01}^2) \cdot \gamma_{12} \cdot e^{-i\delta} \cdot \sum_{m-0}^{\infty} k^m$$

$$(k = \gamma_{12} \cdot \gamma_{10} \cdot e^{-i\delta})$$

$$= \gamma_{01} + \frac{(1 - \gamma_{01}^2) \cdot \gamma_{12} \cdot e^{-i\delta}}{1 - \gamma_{12} \cdot \gamma_{10} \cdot e^{-i\delta}}$$

$$\left( \because \sum_{m-0}^{\infty} k^m = \frac{1}{1-k} \quad |k| < 1 \right)$$

Therefore, the reflectance R can be expressed as follows:

$$R = \frac{\gamma_{01} + \gamma_{12} \cdot e^{-i\delta}}{1 + \gamma_{01} \cdot \gamma_{12} \cdot e^{-i\delta}} \quad (9)$$

Figure 6:
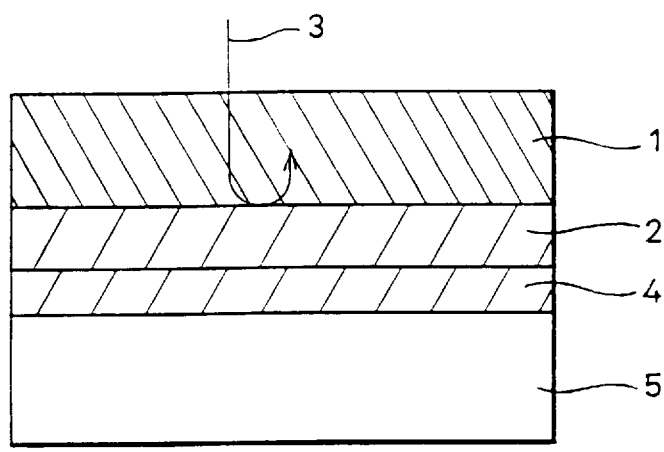
FIG. 6 is a schematic diagram for finding the reflectance when exposure light is directed to a predetermined semiconductor substrate.

Referring to FIG. 6, the case will be considered where oxide film 4 is formed on semiconductor substrate 5, anti-reflection film 2 is formed on oxide film 4, and resist film 1 having an infinite thickness is formed on anti-reflection film 2.

In FIG. 6, Fresnel coefficient ($\gamma$) of reflection between respective films is as follows:
on Si substrate (under oxide film)

$$\gamma_{si} = \frac{n_{sio} - n_{si}}{n_{sio} + n_{si}} \quad (10)$$

on oxide film (under anti-reflection film)

$$\gamma_{sio} = \frac{n_{ARC} - n_{sio}}{n_{ARC} + n_{sio}} \quad (11)$$

on anti-reflection film (ARC) (under resist film)

$$\gamma_{ARC} = \frac{n_{resist} - n_{ARC}}{n_{resist} + n_{ARC}} \quad (12)$$

In the above equations, n denotes the complex refractive index, and indexes denote the kind of films.

The amount of change ($\epsilon$) of the phase by the travel of light into and back from each film is as follows:
in oxide film $$\delta_{sio} = 4\pi d_{sio} \frac{n_{sio}}{\lambda} \quad (13)$$

in anti-reflection film (ARC)

$$\delta_{ARC} = 4\pi d_{ARC} \cdot \frac{n_{ARC}}{\lambda} \quad (14)$$

In the above equations, d represents the thickness of the film, and $\lambda$ represents the wavelength of exposure light in vacuum.

According to the above-described equation (9), the reflectance R when light is multi-reflected in the film is:

$$R(\text{top, bottom}, \Delta) = \frac{\text{top} + \text{bottom} \times \exp(-i \cdot \Delta)}{1 + \text{top} \times \text{bottom} \times \exp(-i \cdot \Delta)} \quad (15)$$

Top denotes the reflectance between a film and a film thereon.

Bottom denotes the reflectance between a film and a film thereunder.

Δ denotes the amount of change of the phase by the travel of light into and back from the film.

From the above, the reflectance $R_{sio}$ on the oxide film when light is multi-reflected in film is:

$$R_{sio} = R(\gamma_{sio}, \gamma_{si}, \epsilon_{sio}) \quad (16)$$

The reflectance $R_{ARC}$ on the anti-reflection film is:

$$R_{ARC} = R(\gamma_{ARC}, R_{sio}, \epsilon_{ARC}) \quad (17)$$

Referring to FIGS. 3 and 4, the optimum value of $n_{ARC}$ is approximately 2.2, and the optimum value of $d_{ARC}$ is approximately 600Å, taking etching characteristics and the like into consideration. In the anti-reflection film, $k_{ARC}$ (the imaginary part of the complex refractive index of the anti-reflection film) is unknown, and in Silicon, since the complex refractive index is known (as for the i-line, 6.55-2.65i, and as for the krF light, 1.58- 3.64i) and the substrate has an infinite thickness, there is no unknown. In the oxide film, the complex refractive index is known (as for the i-line, 1.47, and as for the krF light, 1.51), and the film thickness ($d_{sio}$) is unknown. In the resist, since the complex refractive index is known (as for the i-line, 1.72- 0.02i, and as for the krF light, 1.83- 0.01i) and the upper layer is infinite, there is no unknown. Therefore, as for $R_{ARC}$, unknowns are $k_{ARC}$ and $d_{sio}$.

Figure 7:
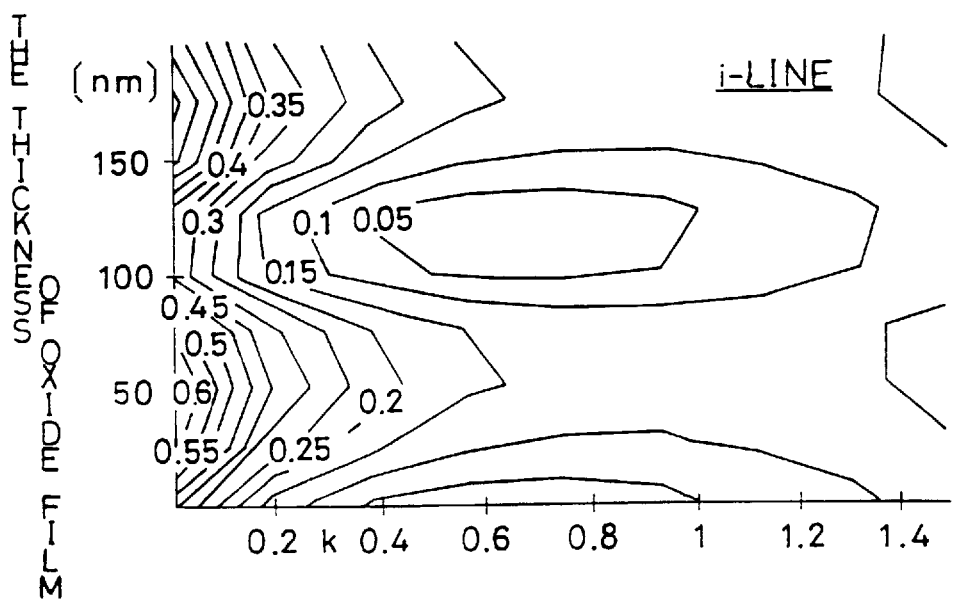
FIG. 7 is a diagram showing the relation between the value of the imaginary part k of the complex refractive index and the thickness of the oxide film at the time of the i-line incidence.
Figure 8:
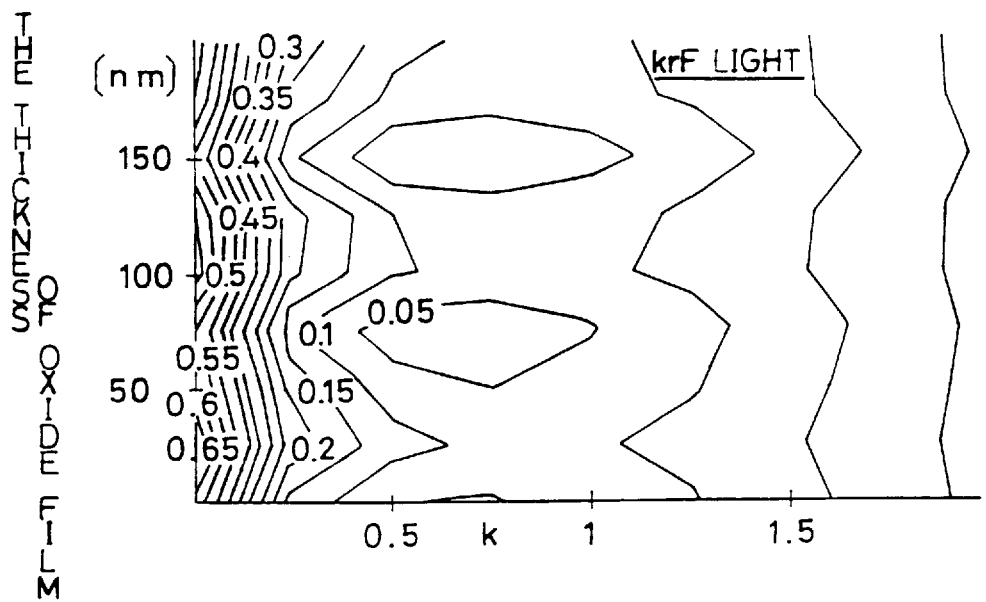
FIG. 8 is a diagram showing the relation between the value of the imaginary part k of the complex refractive index and the thickness of oxide film at the time of the krF light incidence.

According to the above, FIGS. 7 and 8 show the value of $R_{ARC}$ in a diagram of contour lines with regard to two axes of $k_{ARC}$ and $d_{sio}$.

According to FIGS. 7 and 8, it is found that the range of k which makes the reflectance 10% or less even if the film thickness of the underlying oxide film varies (even if there is a change in a longitudinal direction in the figure) is 0.4<k<1.3.

In setting the above-described value of k, calculation was carried out based on the structure of anti-reflection film/oxide film/Si. However, the same result can be obtained with any underlying film since light is substantially attenuated in the anti-reflection film, even if the film thickness of the oxide film under the anti-reflection film changes. The reason why the oxide film is used as an example is that the oxide film satisfies the severest condition of k=0. Therefore, it can be said that data obtained from the above calculation has generality.

As shown in the above embodiment, it is possible to select an optimal anti-reflection film by selecting the ranges of the values of n and k of the film used as the anti-reflection film in the step of selecting the complex refractive index.

An embodiment of the anti-reflection film of the present invention will now be described.

It is conventionally possible to change the refractive index of a plasma nitride film (P - $Si_XN_Y$) formed by a plasma CVD method by changing parameters (X, Y) of the composition of the material.

The plasma nitride film can be formed at a low temperature of 200° through 400° C., with superior characteristics in blockage against moisture and alkali ions, mechanical strength and step coverage.

Figure 9:
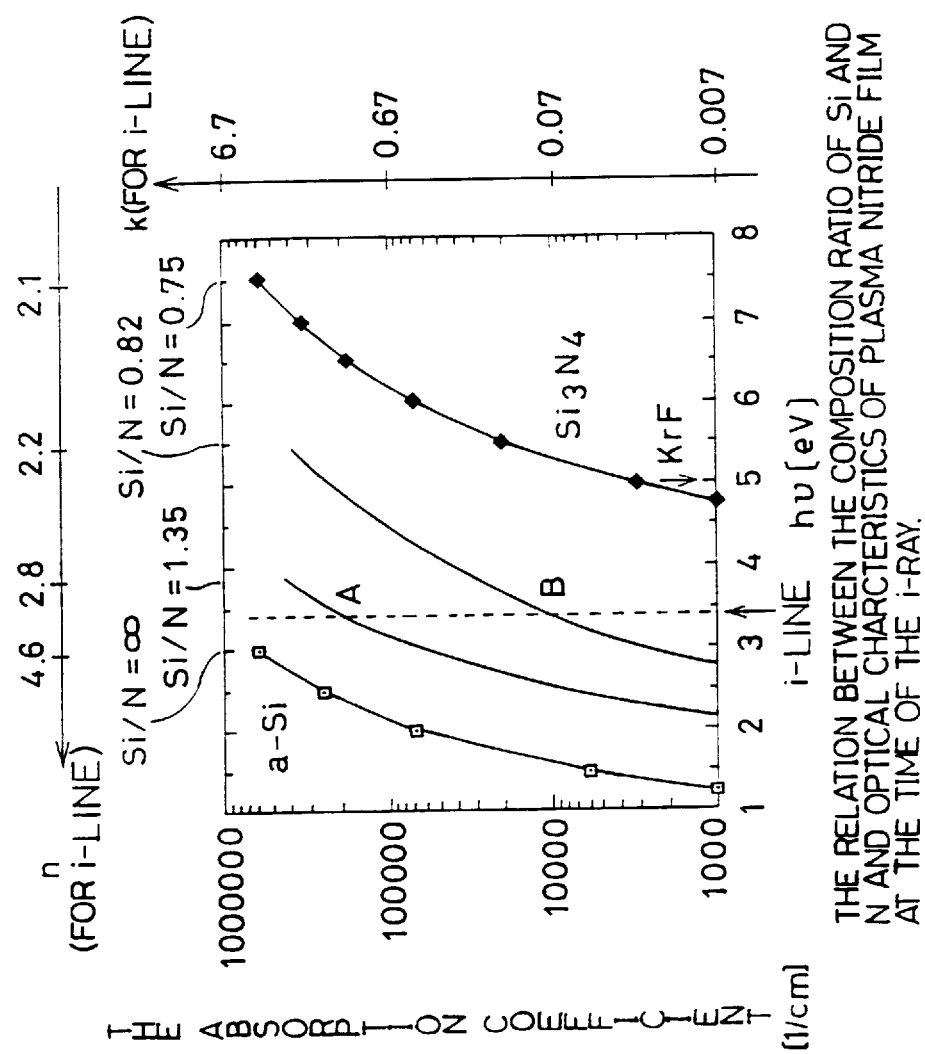
FIG. 9 is a diagram showing the relation between the composition ratio of Si and N and optical characteristics of a plasma nitride film at the time of the i-line incidence.

FIG. 9 shows the relation between the composition ratio of Si to N of the plasma nitride film and optical characteristic at the time of the i-line (λ=365 nm) incidence. In the figure, shown are the cases where the ratios of Si to N are ∞, 1.35, 0.82, and 0.75. As is apparent from the figure, the structure of the plasma nitride film at point A (n=2.8, k=1.3) and the structure of the plasma nitride film at point B (n=2.2, k=0.07) substantially satisfy the condition of the complex refractive index of 1.0<n<3.0, and 0.4<k<1.3. Si/N (=X/Y) is 1.35 and 0.82. As for the point B, since the value of k is small, Si/N<1.0 seems to correspond to k<0.4 if data interpolation is carried out.

Therefore, the composition ratio of parameters (x, y) of the plasma nitride film satisfying 1.0<n<3.0 and 0.4<k<1.3 of the complex refractive index is 1.0<X/Y<1.4.

Figure 10:
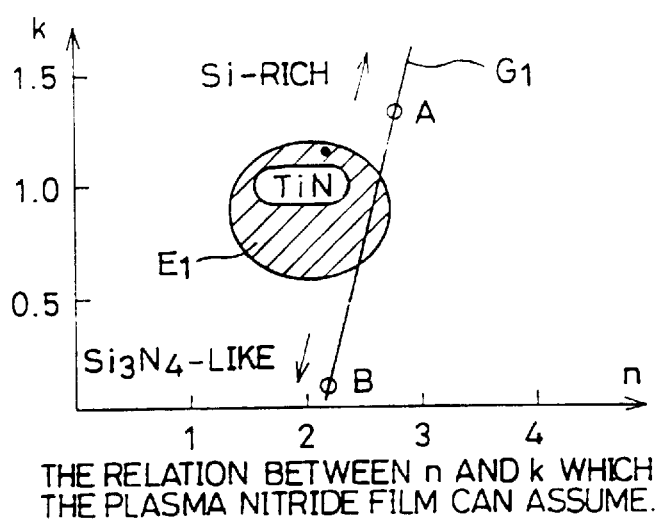
FIG. 10 is a diagram showing the relation between the real part n and the imaginary part k which the plasma nitride film can assume at the time of the i-line incidence.

Referring to FIG. 10, a region $E_1$ shows the range of the values n and k required for an anti-reflection film. A solid line $G_1$ shows the range of the values of n and k which the plasma SiN can assume. According to the above, the range in which the region $E_1$ crosses the solid line $G_i$ shows the condition of the anti-reflection film on the oxide film at the time of the i-line exposure.

Figure 11:
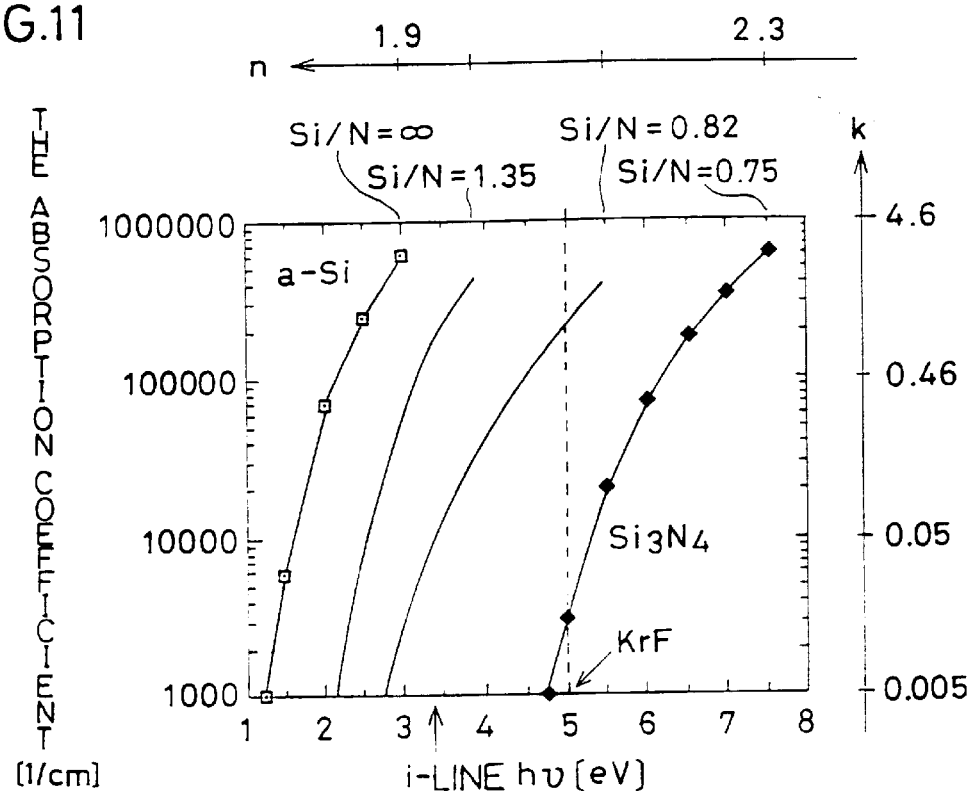
FIG. 11 is a diagram showing the relation of the composition ratio of Si and N and optical characteristics of the plasma nitride film at the time of the krF light incidence.
Figure 12:
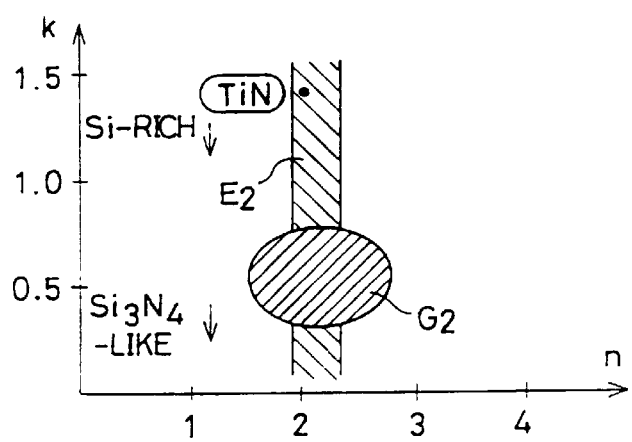
FIG. 12 is a diagram showing the relation between the values of the real part n and the imaginary part k which the plasma nitride film can assume at the time of the krF light incidence.
Figure 13:
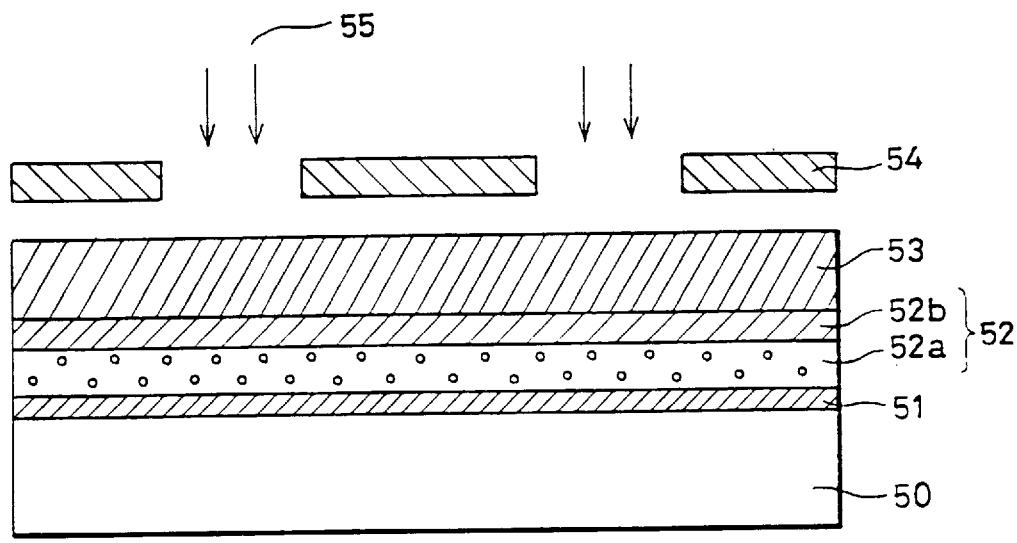
FIGS. 13 to 16 are cross sections showing the first to the fourth steps of the photolithography in the process of manufacturing a conventional semiconductor device.
Figure 14:
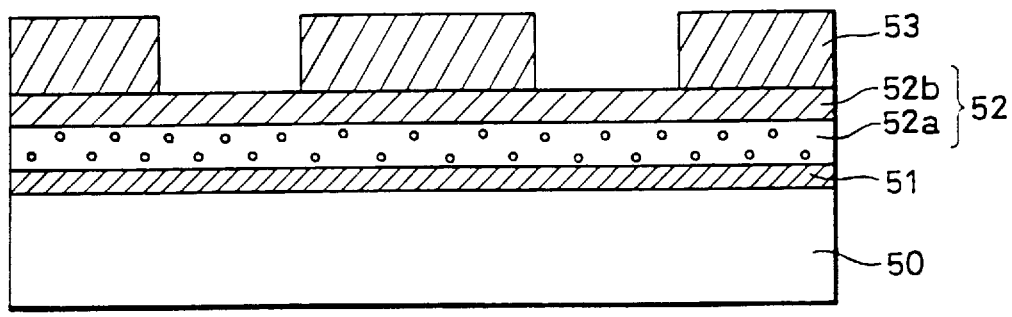
Figure 15:
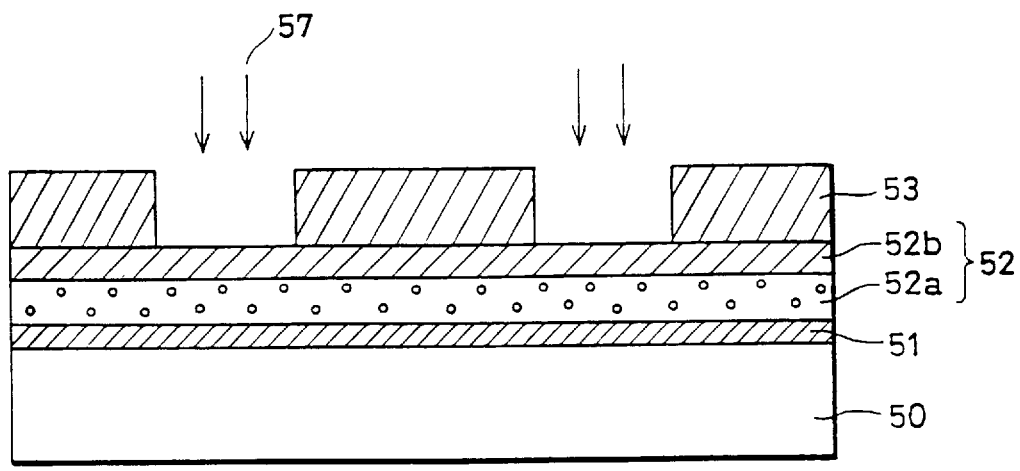
Figure 16:
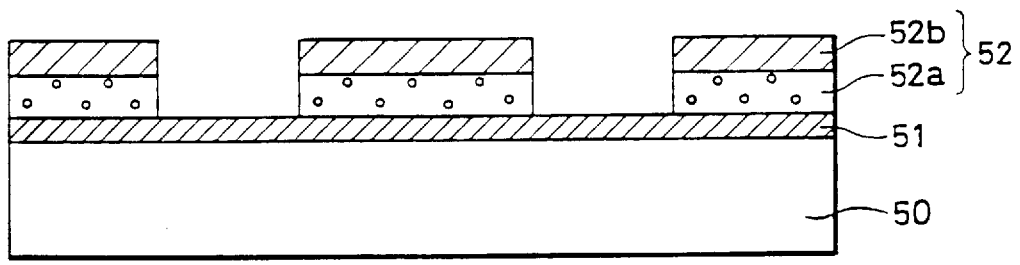
Figure 17:
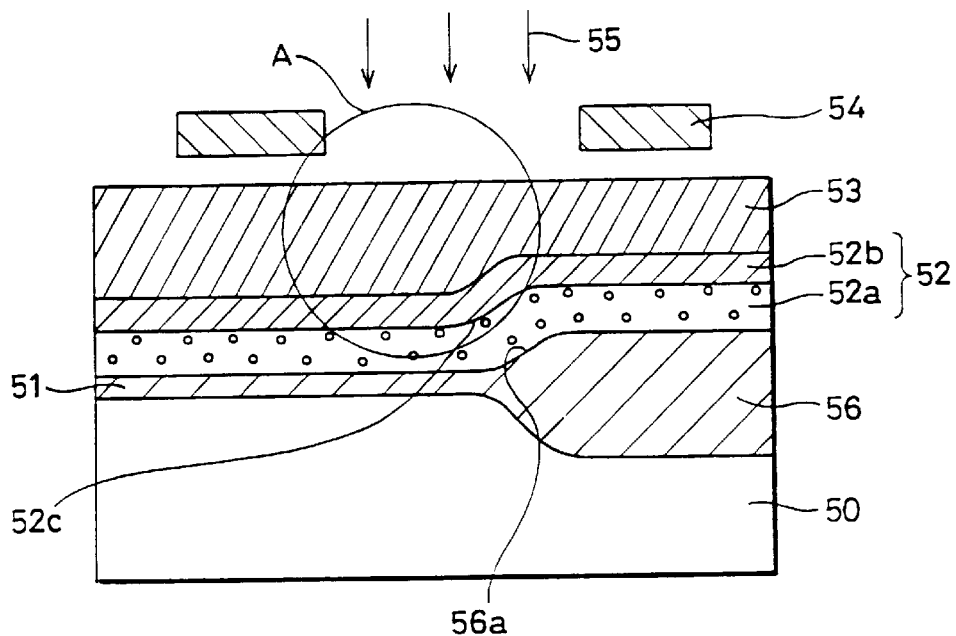
FIG. 17 is a cross section showing a problem of the photolithography in the process of manufacturing the conventional semiconductor device.
Figure 18:
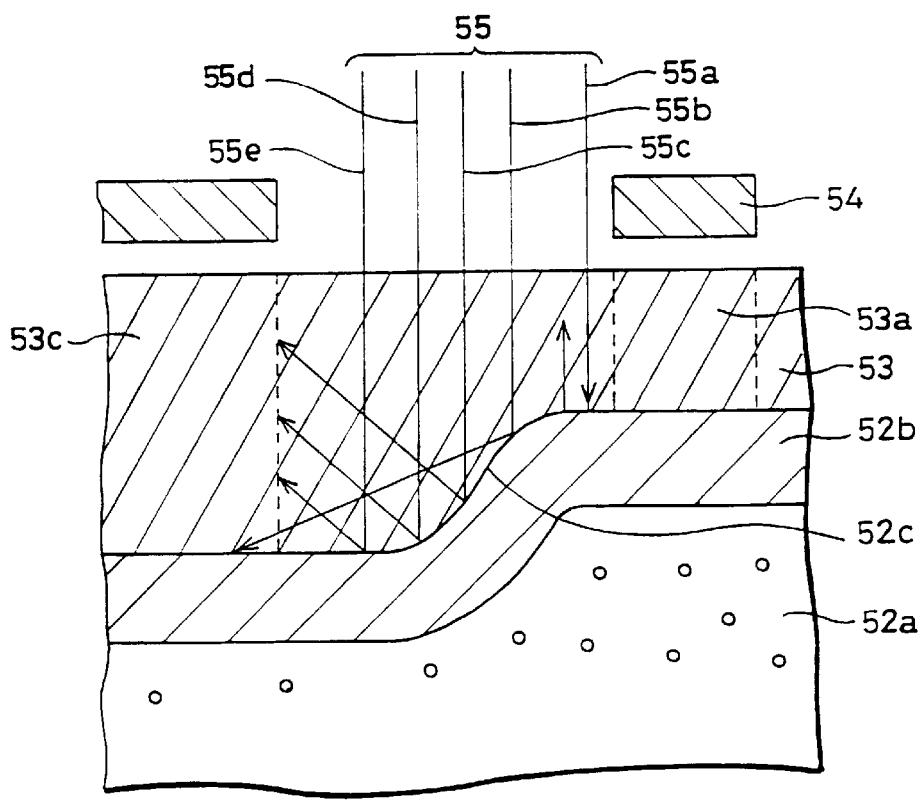
FIG. 18 is a detailed partial cross section showing the problem of the photolithography in the process of manufacturing the conventional semiconductor device.
Figure 19:
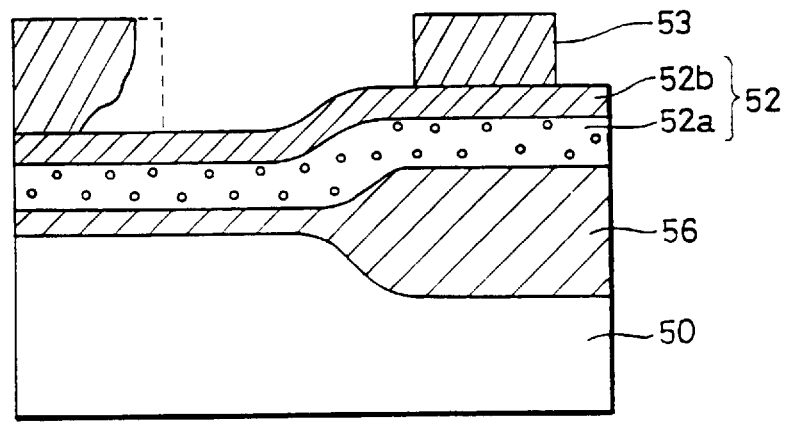
FIGS. 19 to 21 are cross sections showing the first to the third steps showing the problem of the photolithography in the process of manufacturing the conventional semiconductor device.
Figure 20:
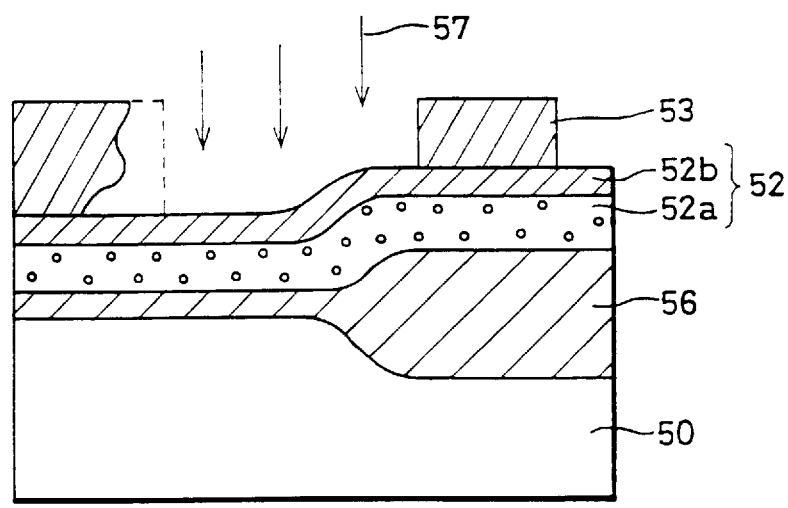
Figure 21:
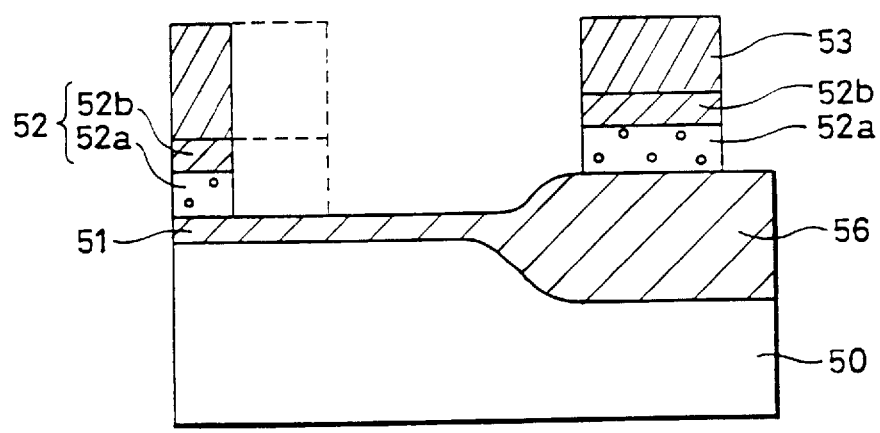
Figure 22:
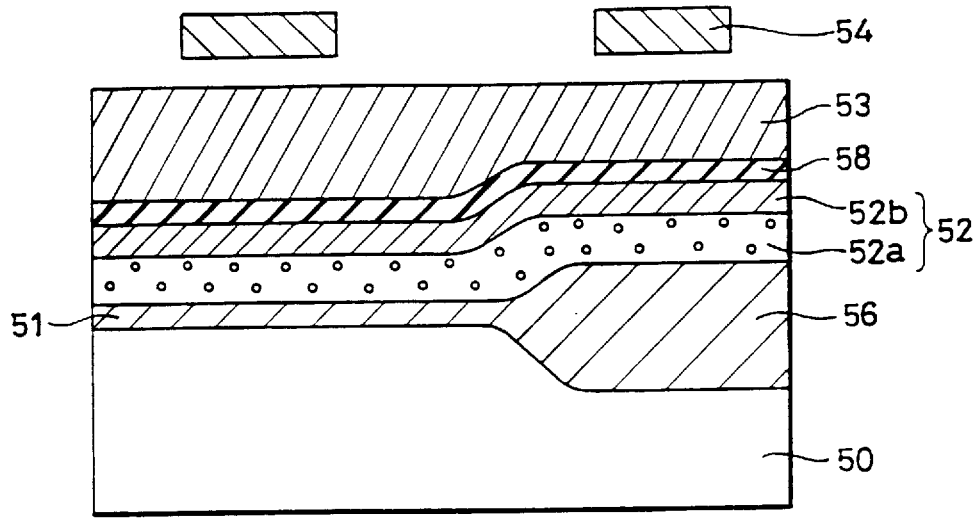
FIGS. 22 to 26 are cross sections showing the first to the fifth steps of the photolithography in the process of manufacturing a semiconductor device having the conventional problem eliminated.
Figure 23:
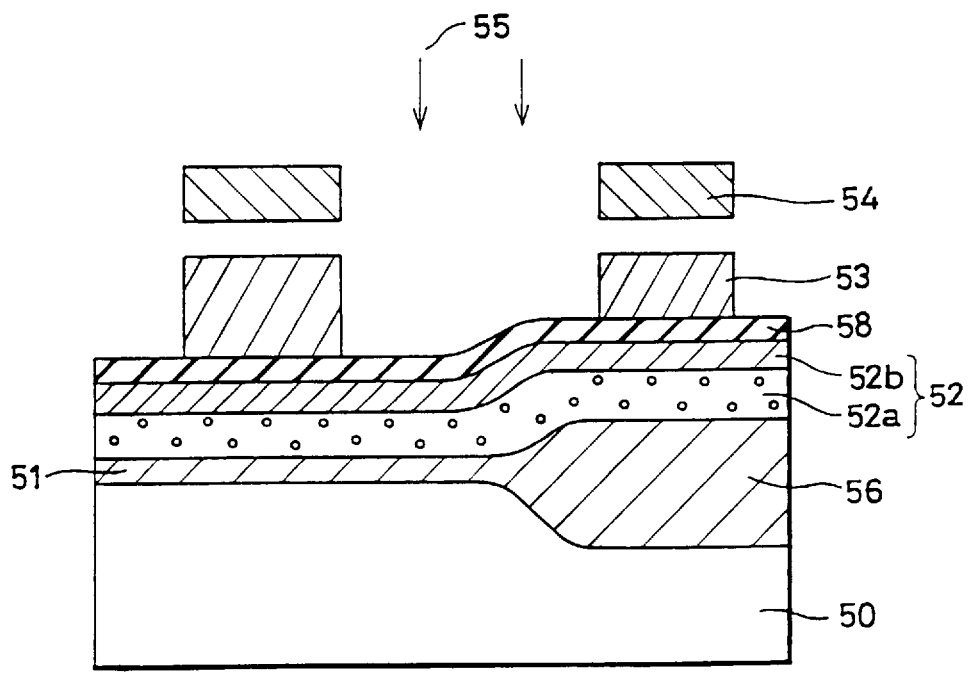
Figure 24:
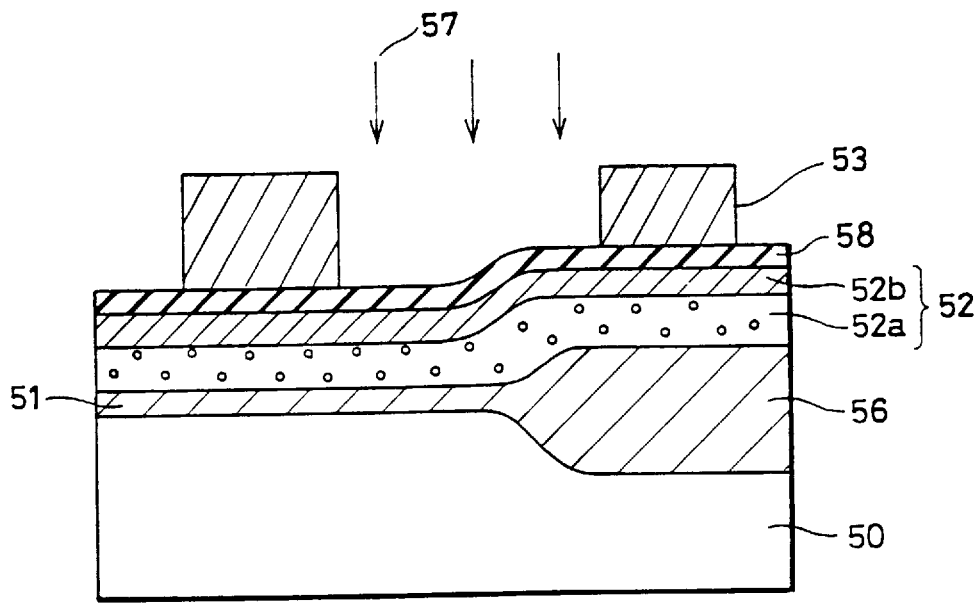
Figure 25:
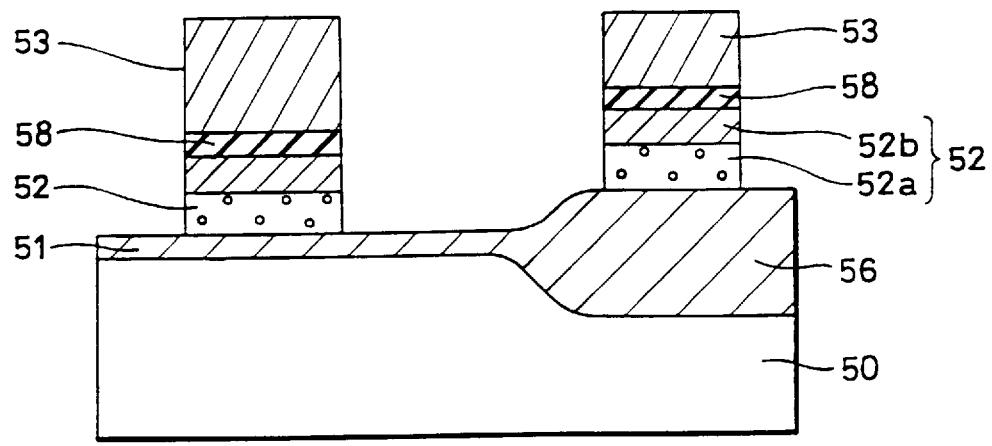
Figure 26:
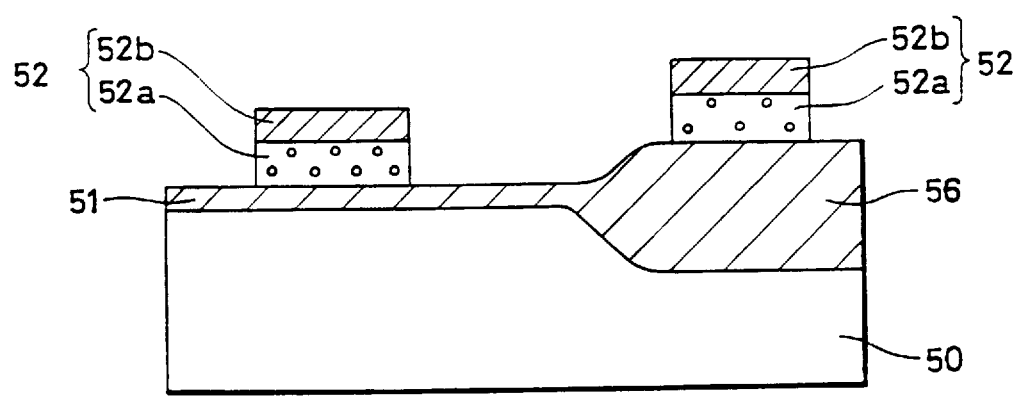

Referring to FIG. 11, description will be given to the relation between the composition ratio of Si to N of the plasma nitride film and optical characteristics at the time of the krF light incidence. In the figure, the cases where the ratios of Si to N are ∞, 1.35, 0.82 and 0.75. As is apparent from the figure, because of the upper limit condition of k<1.3, only the composition ratios of Si/N=0.82 and 0.75 can be solutions. The value of Si/N, 0.75, is the lower limit of the ratio of Si to N. Therefore, it is found that the ratio of composition of parameters of the plasma nitride film satisfying 1.0<n<1.0<n<3.0 and <0.4<k<1.3 of the complex refractive index is 0.75<X/Y<0.8. FIG. 12 is a graph in which the abscissa shows the real part n, and the ordinate shows the imaginary part k based on data of FIG. 11.

In FIG. 12, a region $E_2$ is the range of the values n and k required for an anti-reflection film. A region $G_2$ is the range of the values n and k which the plasma SiN can assume. From the above, the range in which the region $E_2$ crosses the region $G_2$ shows the condition of the anti-reflection film on the oxide film at the time of the krF light exposure.

As described above, by changing parameters of the composition of the material of the plasma nitride film ($Si_XN_Y$) formed by the plasma CVD method, it is possible to set in a predetermined range the values of the real part n and the imaginary part k of the complex refractive index showing optical characteristics of an anti-reflection film, whereby a desired anti-reflection film can be obtained.

According to a method of manufacturing an anti-reflection film based on the present invention, it is possible to manufacture the anti-reflection film by selecting the values of the real part n and the imaginary part of k of the relation n−i×k indicating the complex refractive index as an optical characteristic of the anti-reflection film. As a result, it is possible to obtain an ideal anti-reflection film only by examining the complex refractive index of the material without forming an anti-reflection film on a semiconductor wafer to measure the reflectance experimentally.

According to the method of manufacturing the anti-reflection film based on the present invention, any anti-reflection film can be formed by setting the values of the real part n and the imaginary part k of the complex refractive index n−i×k of the plasma nitride film ($Si_XN_Y$) by changing parameters (X, Y) of the composition of the material of the plasma nitride film ($Si_XN_Y$) formed by the plasma CVD method.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising:

selecting a complex refractive index n−i×k as an optical characteristic of an anti-reflection film;

selecting other characteristics required as the anti-reflection film, wherein said step of selecting the complex refractive index includes the step of determining values of a real part n and an imaginary part k of the relation n−i×k (where i is an imaginary unit) to be in the ranges of $1.0<n<3.0$ and $0.4<k<1.3$, the relation indicating the complex refractive index when exposure light in photolithography has a wavelength in the range of an i-line ($\lambda=365$ nm) to krF light ($\lambda=248$ nm); and patterning a stepped portion of a conductive layer by:

applying said anti-reflection film over the conductive layer on a substrate;

providing a resist mask pattern on the anti-reflection film;

exposing the anti-reflection film to irradiation through the pattern; and removing at least a portion of the anti-reflection film and at least a portion of the conductive layer.

* * * * *